United States Patent
Hilliard et al.

[11] Patent Number: 5,243,186
[45] Date of Patent: Sep. 7, 1993

[54] PHOTONIC ELECTROMAGNETIC FIELD SENSOR APPARATUS

[75] Inventors: Donald P. Hilliard, Oxnard; Dean L. Mensa, Ventura, both of Calif.

[73] Assignee: The United States of America as Represented by the Secretary of the Navy, Washington, D.C.

[21] Appl. No.: 958,404

[22] Filed: Sep. 30, 1992

Related U.S. Application Data

[63] Continuation-in-part of Ser. No. 932,271, Aug. 17, 1992.

[51] Int. Cl.$^5$ .............................................. H01J 5/16
[52] U.S. Cl. ................................. 250/227.17; 343/754
[58] Field of Search .............. 250/225, 227.17, 227.21; 324/96; 343/754; 342/6, 11

[56] References Cited

U.S. PATENT DOCUMENTS

4,458,249  7/1984  Valentino et al. ................... 343/754

Primary Examiner—David C. Nelms
Attorney, Agent, or Firm—David S. Kalmbaugh; Melvin J. Sliwka

[57] ABSTRACT

An electromagnetic field sensor apparatus which measures the amplitude, phase, frequency and polarization of an incoming electromagnetic field as well as the angle of arrival of an incident electromagnetic field. A Luneberg lens focuses an incoming electromagnetic wave entering on one side of the Luneberg lens onto a point on the opposite side of the lens. A pair of photonic sensor which may be electro-optic modulators or Pockel cells are positioned on the Luneberg lens at the point upon which the incident electromagnetic wave is focused. The sensing axis of one of the electro-optic modulators is perpendicular to the sensing axis of the other electro-optic modulator. Polarized light is provided to each photonic sensor along an optical path which passes through the sensor. Each photonic sensor modulates the polarized light passing therethrough when the photonic sensor detects the incident electromagnetic wave. A photo-detector located along the optical path for each photonic sensor detects the modulated light as it exits from the photonic sensor. The signal output of each photo-detector is electrically coupled to a power combiner and divider circuit which in combination with a network analyzer is utilized to measure the polarization of an incident electromagnetic wave.

20 Claims, 5 Drawing Sheets

PHOTONIC ELECTROMAGNETIC FIELD SENSOR APPARATUS

This application is a continuation-in-part of application Ser. No. 07/932,271, filed Aug. 17, 1992.

BACKGROUND OF THE INVENTION

1. Field of the Invention

The present invention relates generally to electromagnetic field measuring devices and more particularly to an instrument which utilizes a Luneberg lens for the measurement of the polarization of an incident electromagnetic field.

2. Description of the Prior Art

There is currently a need for an apparatus which will measure incoming electromagnetic wave fronts. Such an apparatus should have the capability of detecting radar and communications signals as well as determining the angle of arrival of any incoming other electromagnetic wave front without the scattering of the wave front which is normally associated with conventional electromagnetic field sensing apparatus. In addition, such an apparatus should have the capability of detecting the polarization of an incident electromagnetic field.

The detection and measurement of electromagnetic field radiation which may pose a biological threat to mankind has also become increasingly important in view of the rapid proliferation of electronic appliances such as microwave ovens, radar systems, medical apparatus such as diathermy equipment and the like. Both state and federal agencies have promulgated criteria for maximum electromagnetic radiation exposure in the vicinity of commercial and military radar equipment and microwave appliances. Accurate monitoring of fields emitted from such appliances and radar equipment requires that the introduction of the monitoring device into the vicinity of the microwave appliance or radar equipment will not result in significant perturbations of the electromagnetic field to be measured and a resultant loading of the radiation source. Furthermore, the relatively small permissible radiation exposure safety levels require a monitoring device that is capable of accurately measuring small field strengths.

Prior art electromagnetic field sensing devices have utilized metallic cables which tend to perturb the field being monitored thus reducing the accuracy of the resulting measurements. Prior art electromagnetic field sensing devices have also utilized a metallic antenna attached to a conducting transmission line, for example a coaxial cable, which electrically couples the antenna to a receiver unit. However, this prior art sensing device has the disadvantage that the conducting transmission is subject to line losses which limits the length of the cable to a few meters for the measurement of microwave measurements. In addition, the antenna and the transmission line of this prior art sensing device develop surface currents which are induced by the incident electromagnetic fields being sensed, thereby creating scattered electromagnetic fields. These scattered electromagnetic fields disturb the incident electromagnetic fields being sensed reducing the accuracy of the electromagnetic field measurements. Further these scattered electromagnetic fields provide a signature for enemy detectors in a hostile environment.

A more recent field measurement system employs diode detectors connected to an antenna to detect electromagnetic radiation. The diode detector employs a high-ohmic transmission line to transfer the detected signal to a readout device which allows extraneous noise to be picked up by the antenna. The bandwidth of the information transmitted on the high-ohmic transmission line is quite small, precluding the observation of short electromagnetic pulses or rapid modulation of the fields under study. Light emitting diodes connected to an antenna are impractical for the measurement of fields whose strengths even approach the small magnitude required to enforce the maximum radiation exposure criteria. The prior art light emitting diode is an active device, drawing its power from the field being monitored. Approximately 1.3 volts must be applied to the light emitting diode before any light is emitted whatsoever. However, only a few millivolts of radio-frequency or microwave energy are available from an electrically small, non-perturbing antenna in the presence of an electric field whose intensity is strong enough to just exceed the radiation exposure hazard criteria for RF or microwave appliances. In addition, the prior art light emitting diode device distorts the instantaneous signal which is received by the antenna to which it is connected, thereby reducing the accuracy of the measurement of the amplitude, phase and frequency thereof.

A need therefore exists for an electromagnetic field sensing apparatus which provides a long-sought solution to the problem of accurately measuring potentially hazardous electromagnetic radiation to confirm safe exposure criteria. There is also a need for a low scattering electromagnetic field sensing apparatus which will monitor radar and communications signals as well as measure electromagnetic fields amplitude, phase, frequency, angle of arrival and polarization on board ships, in anechoic chambers and like environments.

SUMMARY OF THE INVENTION

The purpose of the present invention is to provide an electromagnetic field sensor apparatus which measures the amplitude, phase, frequency and polarization of an incoming electromagnetic field as well as the angle of arrival of an incident electromagnetic field. The present invention includes a Luneberg lens which focuses an incoming electromagnetic wave entering on one side of the Luneberg lens onto a point on the opposite side of the lens. A pair of photonic sensors which may be electro-optic modulators or Pockel cells are positioned on the Luneberg lens at the point upon which the incident electromagnetic wave is focused. The sensing axis of one of the electro-optic modulators is perpendicular to the sensing axis of the other electro-optic modulator. Polarized light is provided to each photonic sensor along an optical path which passes through the sensor. Each photonic sensor modulates the polarized light passing therethrough when the photonic sensor detects the incident electromagnetic wave. A photo-detector located along the optical path for each photonic sensor detects the modulated light as it exits from the photonic sensor. In this manner incident electromagnetic fields may be detected and measured without having scattered fields effect the measurement due to the lack of a metallic antenna and metallic wires/conductors which are normally attached to the antenna as in conventional electromagnetic field measurement devices. Further, the signal output of each photo-detector is electrically coupled to a power combiner and divider circuit, which in combination with a receiver such as a network analyzer, is utilized to measure the polarization of an incident electromagnetic wave. In the present invention a polarization preserving optical fiber may be used to transmit the polarized light from the source to the photonic sensor. In addition, multiple sensors may be positioned on the outer surface of the Luneberg lens to allow for the measurement of the amplitude, phase, angle of arrival, frequency and polarization of an incoming electromagnetic wave. In the present invention, the electro-optic modulator may be fabricated from second order nonlinear optical polymers which exhibit low dielectric constants thereby reducing perturbations to the incident electromagnetic wave.

It is therefore an object of the invention to monitor electromagnetic radiation in free space or in the near field of a radiating source in an improved manner.

It is a further object of the invention to monitor electromagnetic radiation having a small field strength in an improved manner.

It is another object of the invention to provide an apparatus which measures the angle of arrival of an incident electromagnetic field.

It is still another object of the invention to measure the electromagnetic field strength in amplitude, phase, and frequency of incident electric and magnetic fields.

It is yet another object of the invention to monitor electromagnetic fields while causing negligible scattering of the fields being monitored.

It is yet a further object of the invention to provide an apparatus which allows measurement of the polarization of incident electromagnetic fields.

It is still a further object of the present invention to provide an apparatus which allows measurement of the polarization of an incoming electromagnetic wave to determine the type of antenna system from which the electromagnetic wave was radiated, for example, whether the antenna is circularly polarized, elliptically polarized or linearly polarized.

Still further objects, advantages and novel features of the present invention will become apparent from the following detailed description of the invention when considered in conjunction with the drawings.

DETAILED DESCRIPTION OF THE PREFERRED EMBODIMENT

The preferred embodiment of the present invention will now be discussed in conjunction with all of the figures of the drawings.

Figure 1:
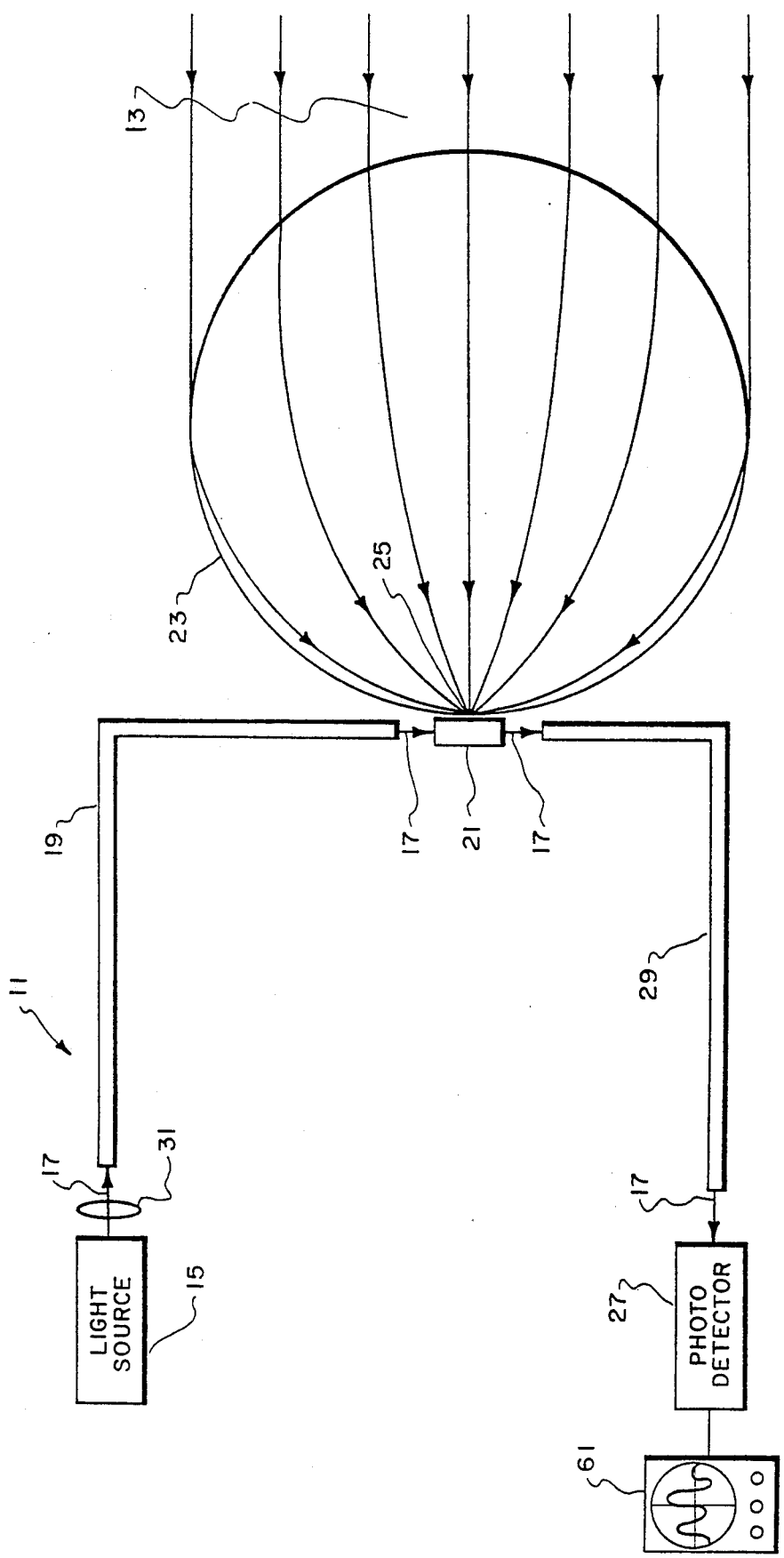
FIG. 1 is a schematic view illustrating the basic elements of the photonic electromagnetic field sensor apparatus constituting the present invention.

Referring now to all of the drawings and in particular to FIG. 1, the basic elements necessary for the operation of the present invention are shown. FIG. 1 shows a photonic electromagnetic field sensor apparatus 11 in free space which operates with negligible perturbation upon an incident electromagnetic field 13 which ma be a planar or spherical wave front and may be elliptically, circularly or linearly polarized. The apparatus 11 of the present invention comprises a light source 15 positioned along an optical path 17 for transmitting a monochromatic beam of laser light along optical path 17 through a polarization maintaining optical fiber 19 to a photonic sensor 21. Photonic sensor 21 is positioned on the outer surface of Luneberg lens 23 at a focal point 25 and will modulate light entering the sensor 21 along optical path 17 when electromagnetic field 13 is incident on sensor 21 at point 25. In the preferred embodiment of the present invention photonic sensor 21 may be a Pockel cell which is an electro-optic material having the property of variable birefringence.

There is positioned along optical path 17 down stream from sensor 21 a photo-detector 27 for detecting the modulated light as it traverses the sensor 21 and then exits from sensor 21 through an optical fiber 29 positioned on path 17 to photo-detector 27. In operation photonic sensor 21 detects weak electromagnetic fields while imposing a negligible perturbation thereon.

Also shown in FIG. 1 is a polarizer 31 located along optical path 17 between the light source 15 and the polarization maintaining optical fiber 19. Polarizer 31 polarizes the light provided by source 15 and then transmitted through fiber 19 to sensor 21.

The light source 15 used in the preferred embodiment of the present invention may be any conventional light source, but preferably is a source of monochromatic laser light having a wavelength of approximately 1.3 microns so that the monochromatic laser light may be transmitted through polarization maintaining optical fiber 19 which efficiently transmits light having a wavelength of approximately 1.3 microns. A preferred light source is a Neodymium YAG laser which operates at a wavelength of 1.32 microns and is manufactured by Schwartz Electro-Optics Inc. of Orlando, Fla.

The theory of electro-optic modulation has been extensively discussed in the literature, for example F. S. Chen, "Modulators for Optical Communications", proceedings of the IEEE, Vol. 58 No. 10, Oct. 1970, pages 1440–1457 and "Optical Waves in Crystals, Propagation and Control of Laser Radiation" by Amnon Yariv and Pochi Yeh. The literature discusses the electro-optic properties of a number of different materials and modulator configurations employing electro-optic modulators. Suitable electro-optic materials for the composition of photonic sensor 21 may be selected from the group consisting of crystals such as $LiNbO_3$, $LiTaO_3$, $KD_2PO_4(DKDP)$, $Ba_2NaNb_5O_{15}$, $Sr_{0.25}Ba_{0.75}Nb_2O_6$ and $BaTiO_3$.

Photonic sensor 21 may also be fabricated from second order nonlinear optical polymer materials, called an electro-optic polymer, which have response times in picoseconds and very low index amplitude modulation requirements of less than ten and greater than minus two. Further, the dielectric constant exhibited by these second order nonlinear optical polymers is generally less than 3.5 as opposed to conventional inorganic electro-optic materials which have dielectric constants greater than 35. Electro-optic polymers include those manufactured by Dupont and Hoest Celanese Corporation. Preferred electro-optic polymers for fabricating photonic sensor 21 may be, for example, methyl nitro aniline or polymethylmethacrylate. In addition, several electro-optic polymers which may be used to fabricate photonic sensor 21 are disclosed in U.S. Pat. No. 5,061,404, issued Oct. 29, 1991, to Chengjiu Wu et. al.

Photonic sensors exhibit a property identified as Pockel's linear electro-optic effect which means that the index of refraction of electro-optic materials such as lithium niobite, lithium tantalate and polymethylmethacrylate changes proportionally to the strength of an electric field being measured with this change being generally exhibited over a frequency range of from 1 hertz to 1000 GHz. The response of these materials to the electric field being measured is directly proportional to a factor known as the electro-optic coefficient which has the units of meters/volt. The electro-optic coefficient is a tensor quantity and is typically, but not always, large in the direction of one axis of the electro-optic material and weak in the remaining two axis of the material. When laser light is passed through the electro-optic material it is modulated by the changing index of refraction of the material in proportion to the strength/intensity of the electric field being measured. The laser light passing through the electro-optic material may then be measured by detector means such as photo-detector 27.

These electro-optic materials also have the common property that they enter a state of variable birefringence which is proportional to the magnitude of the field strength imposed across the material. When polarized laser light propagates through the material, it undergoes a rotation in the direction of polarization which is proportional to the distance traversed in the material and the magnitude of the birefringent state. By polarizing laser light prior to entry into a electro-optic material and analyzing the polarized laser light after the light propagates through the material and undergoes a rotation of its polarization direction, by means of a polarizing analyzer apparatus, the extent of the rotation of the plane of polarization due the birefringent state can be measured. This phenomenon, known as the Pockels effect, is well known in the literature. In addition, the use of a polarizing analyzer apparatus to measure the extent of rotation of the plane of polarization after polarized laser light propagates through an electro-optic crystal is thoroughly discussed in U.S. Pat. No. 4,070,621, issued Jan. 24, 1978 to Howard I. Bassen and Richard Peterson. U.S. Pat. No. 4,070,621 also discloses signal processing circuitry which may be used with a photo-detector, such as photo-detector 27, and which will measure the amplitude, phase and frequency of an incident electromagnetic field.

Figure 2:
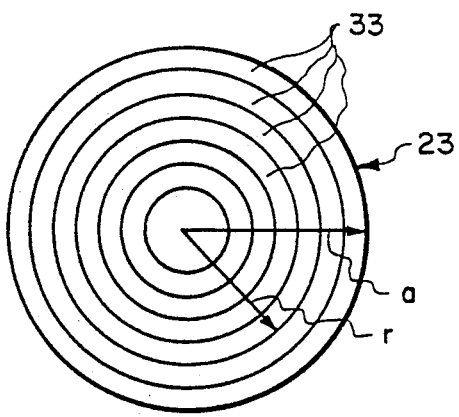
FIG. 2 is a schematic view illustrating the Luneberg lens used in the preferred embodiment of the present invention.

Referring now to FIG. 2, there is shown the Luneberg lens 23 used in the preferred embodiment of the present invention. The Luneberg lens is fabricated by stacking concentric shells 33 of polystyrene material with the dielectric constant of each shell 33 given by the following expression:

$$\epsilon_r[r] = 2 - [r/a]^2 \quad (1)$$

where a is the radius of the lens, r is the radial distance from the center of the lens, and $\epsilon_r[r]$ is the relative permittivity of Luneberg Lens 23 which varies as a function of distance from the center of the lens having a maximum value of two at the center of the lens and a minimum value of one at the radius a of lens 23. Because of the low permittivity of polystyrene, the Luneberg lens 23 used in the preferred embodiment of the present invention will not generate scattered electromagnetic fields which limits the accuracy of the measurements provided by photonic electromagnetic field sensor apparatus 11.

Figure 3A:
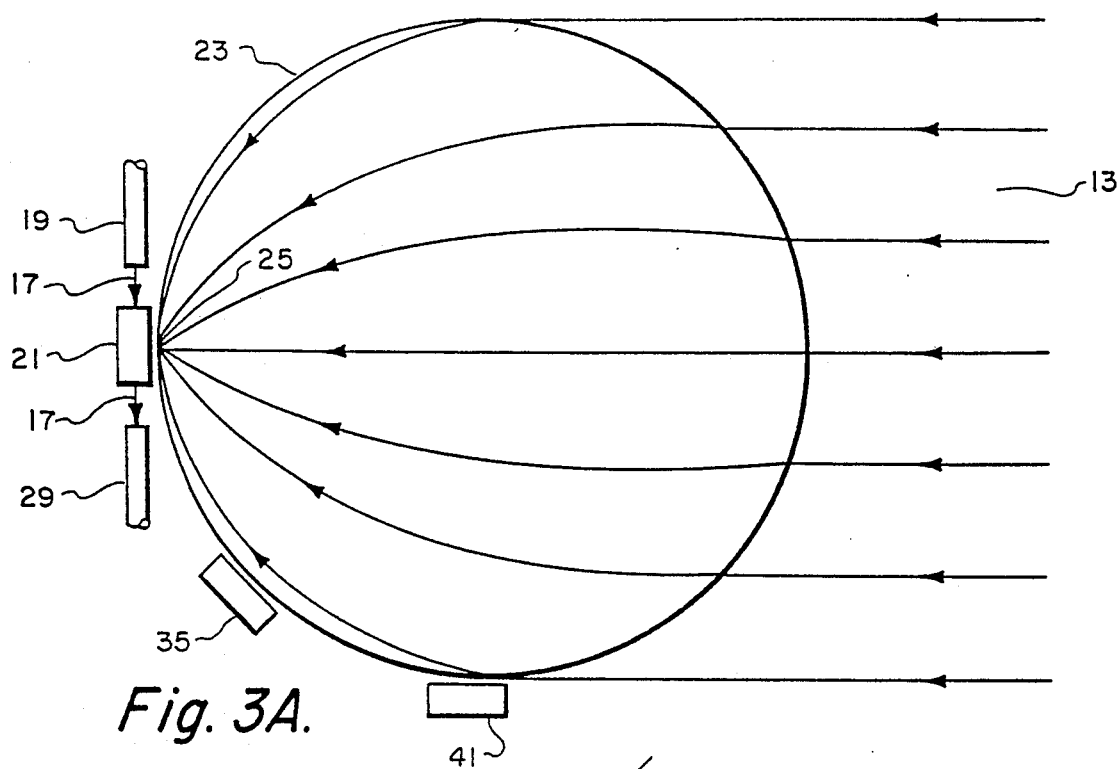
FIG. 3(A) thru 3(B) illustrate electromagnetic wave fronts incident on the Luneberg lens of the present invention at different angles of arrival.
Figure 3B:
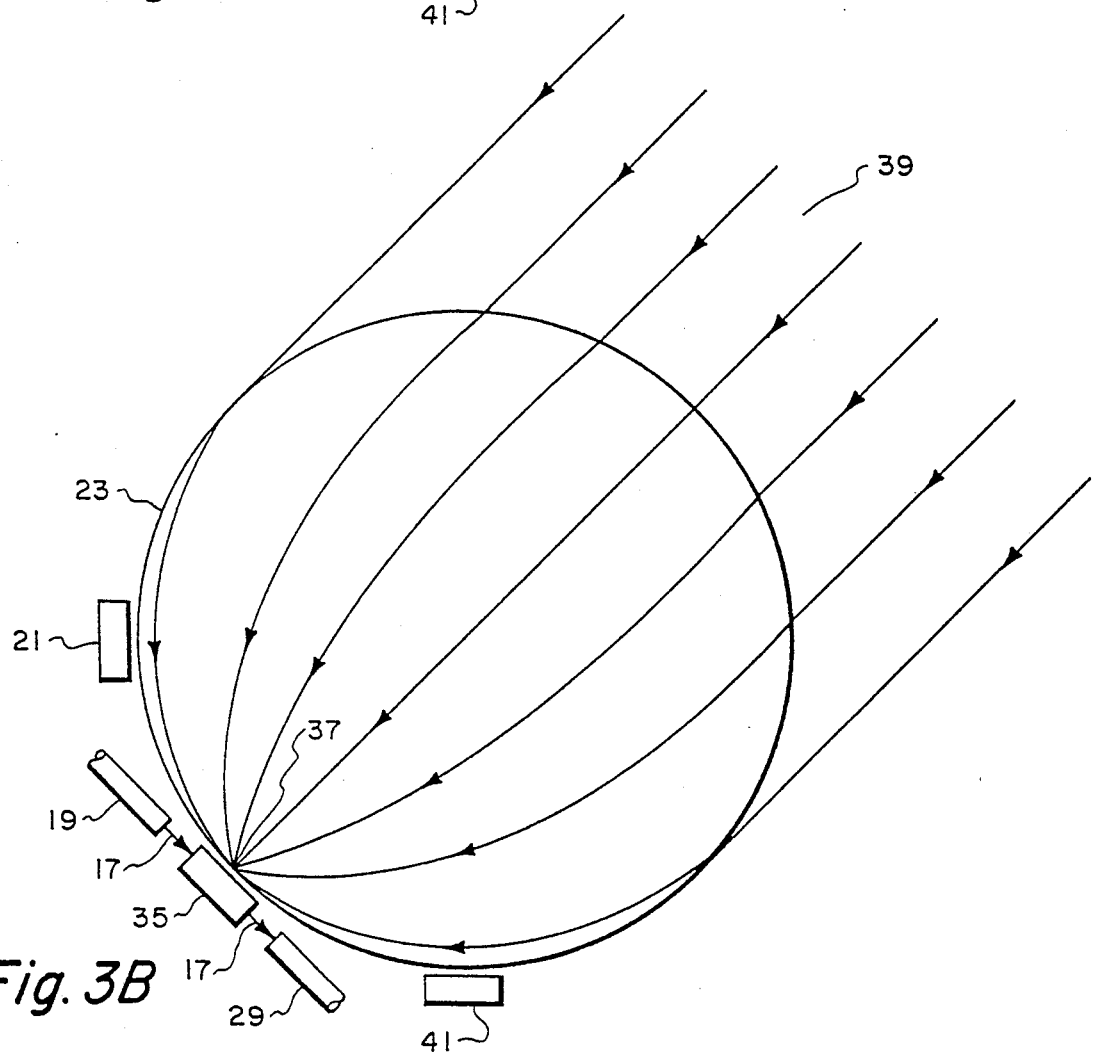

Referring now to FIGS. 1 and 3, there is shown Luneberg lens 23 having photonic sensor 21 positioned on the outer surface of lens 23 at the focal point 25 of incident electromagnetic wave 13. Application of electromagnetic field 13 to sensor 21 modulates laser light propagating through sensor 21 along optical path 17 with the degree of modulation of the laser light being in direct proportion to field 13 and thus the strength of field 13 being measured by photo-detector 27. Likewise, a photonic sensor 35 may be positioned on the outer surface of Luneberg lens 23 at a focal point 37 which is approximately forty five degrees in the counterclockwise direction from sensor 21. An electromagnetic wave 39 incident upon Luneberg lens 23 at angle of forty five degrees from the vertical plane will be focused on sensor 35 as is best illustrated by FIG. 3(B) with sensor 35 modulating laser light propagating therethrough so that a second photo-detector, not illustrated, may measure the strength of electromagnetic wave 39. A third photonic sensor 41 may positioned on the outer surface of Luneberg lens 23 ninety degrees in a counterclockwise direction from sensor 21. Sensor 41 will, in turn, allow photonic electromagnetic field sensor apparatus 11 to measure the strength/intensity of an electromagnetic wave incident on Luneberg lens 23 in a horizontal plane. It should be understood that each sensor 21, 35 and 41 has a separate measuring device, that is a separate photo-detector, for measuring the strength/intensity of an incoming electromagnetic field, thus allowing photonic electromagnetic field sensor apparatus to distinguish between different electromagnetic wave fronts.

Figure 4A:
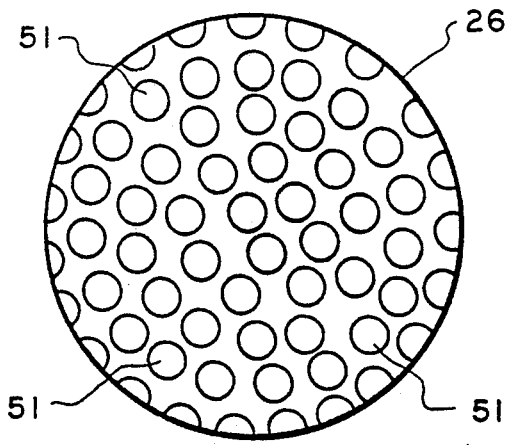
FIG. 4(A) thru 4(C) illustrate a Luneberg lens having a plurality of photonic sensors.

Referring now to FIG. 4, photonic sensors may be positioned at a plurality of locations on the outer surface of a Luneberg lens 26 to measure the intensity of any electromagnetic wave incident on Luneberg lens 26 irregardless of the angle of arrival of the wave. In addition, by positioning photonic sensors around the outer surface of Luneberg lens 26 in the manner illustrated by FIG. 4, the angle of arrival of any incoming electromagnetic wave may be measured by apparatus 11 since Luneberg lens 26 will focus the incoming wave on a particular focal point thereby focusing the wave on the photonic sensor positioned at that particular focal point. For example, the Luneberg lens of the present invention will focus an electromagnetic wave 39 arriving at an angle of forty five degrees on photonic sensor 35, FIG. 3(B) which will, in turn, result in only laser light propagating 5 through sensor 35 being modulated by sensor 35. By utilizing a photodiode 57 of the type illustrated in FIG. 5 for receiving the modulated light signal from sensor 35 photo-detector 27 provides at its output an electrical signal having an amplitude that varies as function of the amplitude and phase of the incident wave 39.

The angle of arrival of wave 39 may be determined directly by noting the response of the corresponding photo-detector measuring light modulated by sensor 35.

Figure 4B:
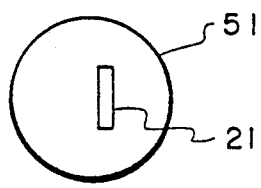
Figure 4C:
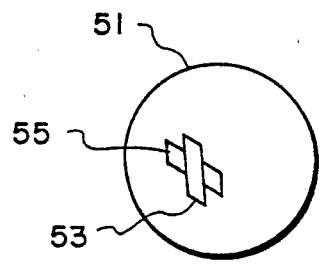

Referring again to FIG. 4, there is shown Luneberg lens 26 having a plurality of photonic sensor elements 51 which may be a conventional photonic sensor 21 as is best illustrated in FIG. 1 and FIG. 4(B), or a photonic sensor having large electro-optic coefficients in the two axis that are tangent to the surface of the lens, or two separate single photonic sensors 53 and 55 with large electro-optic coefficients in a single axis positioned orthogonal to each other and tangent to the surface of lens 26. The large electro-optic coefficients for each photonic sensor 53 and 55 is the sensing axis for the photonic sensor. Thus, the sensing axis for photonic sensor 53 which is the Y axis is perpendicular to the sensing axis for photonic sensor 55 which is the X axis. As is best illustrated by FIG. 4(c), either configuration will enable the sensing of any arbitrarily polarized electromagnetic field incident on Luneberg lens 26. The specific polarization of the incident electromagnetic field may be determined by means of a conventional polarization analyzer apparatus, not shown, or by the circuit illustrated in FIG. 6.

Figure 5:
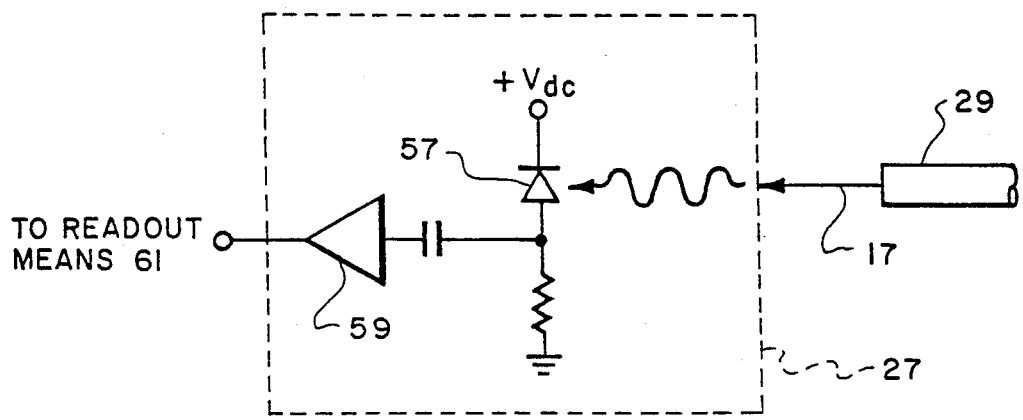
FIG. 5 is an electrical schematic diagram for the photo-detector used in the preferred embodiment of the present invention.

Referring now to FIG. 5, there is shown an electrical schematic of photo-detector 27 which includes a photodiode 57 for receiving the modulated laser light from sensor 21 and providing an electrical signal in response to the modulated light signal having an amplitude that varies in response to the degree of modulation of the laser light by sensor 21. The electrical signal is then amplified by a low noise amplifier 59 and supplied to conventional readout means 61 such as an oscilloscope which provides a visual indication of the amplitude, phase, and frequency of the incoming electromagnetic wave 13.

Figure 6:
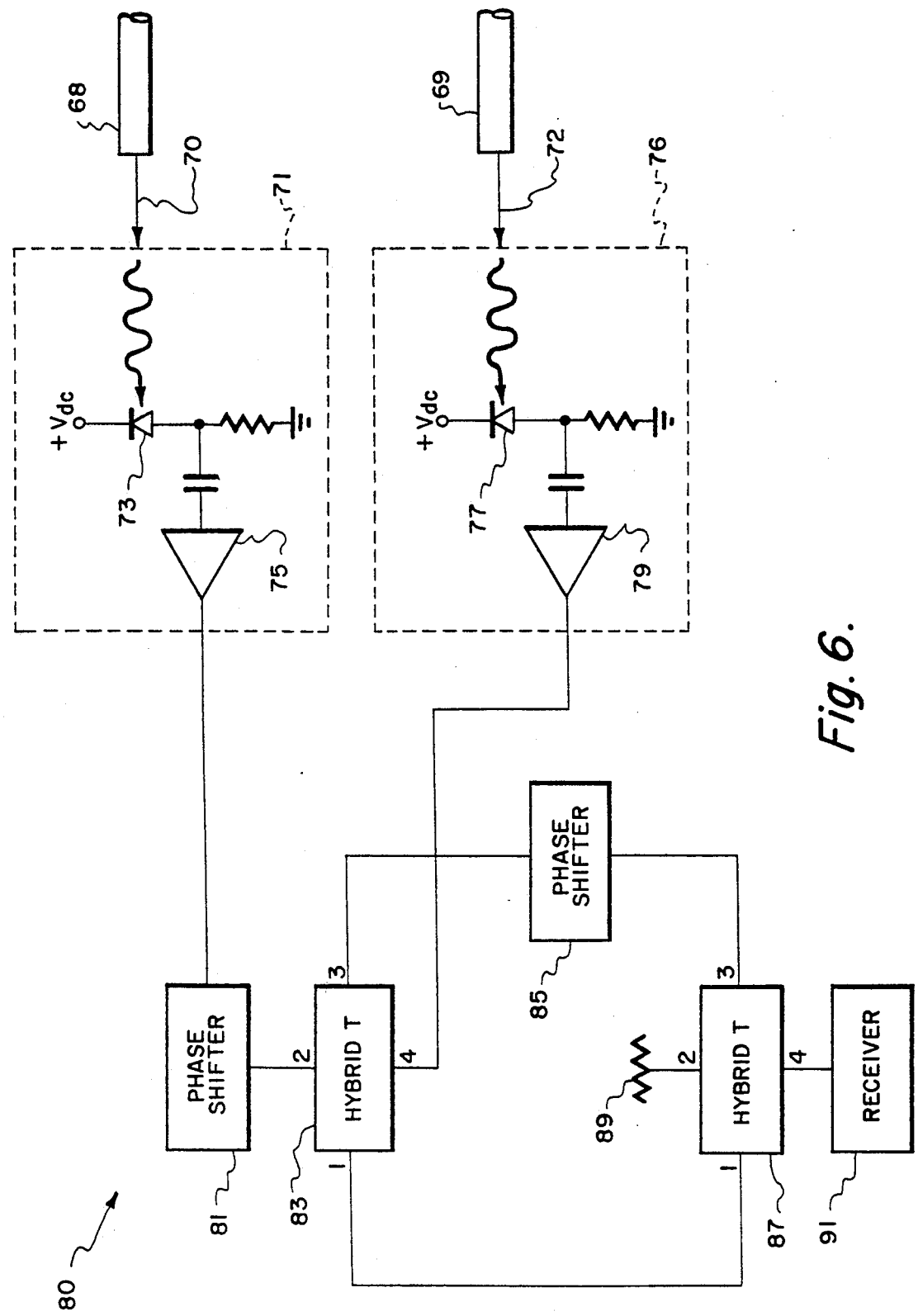
FIG. 6 is an electrical schematic diagram of the power combiner and divider circuit which in combination with a network analyzer is utilized to measure the polarization of an incident electromagnetic wave.

Referring to FIGS. 4(C) and 6, when an electromagnetic wave is focused by Luneberg lens 23 on photonic sensors 53 and 55, modulated light from sensor 53 is transmitted through optical fiber 68 along optical path 70 to photo-detector 73, while modulated light from sensor 55 is transmitted through optical fiber 69 along optical path 72 to photo-detector 77. The degree of modulation of light exiting sensors 53 and 55 will vary depending upon the polarization the incident electromagnetic wave detected by sensors 53 and 55.

Figure 7A:
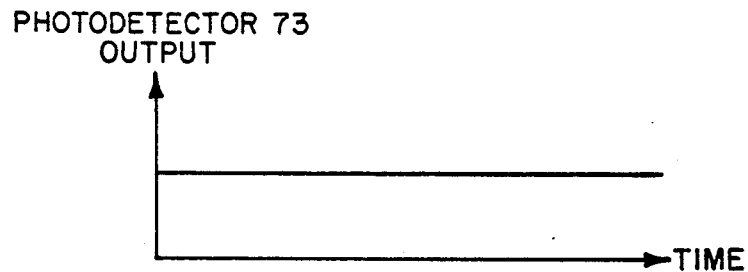
FIG. 7(A)-7(B) illustrates representative waveforms provided at the output of the photo-detectors used with the circuit of FIG. 6 to determine the polarization of an incident electromagnetic wave.
Figure 7B:
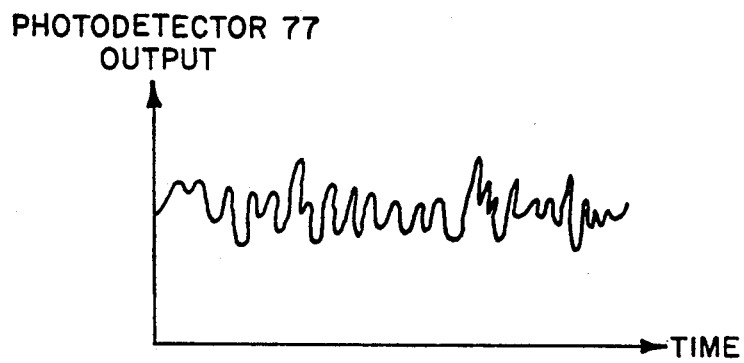

Thus, for example, when the electric field vector of an incoming electromagnetic wave is in a horizontal plane, the degree of modulation of light exiting sensor 55 is maximum, while light exiting sensor 53 is not modulated. Photo-detector 77 which detects modulated light from sensor 55 will provide at its output the modulated electrical signal of FIG. 7(B), while the photo-detector 73 which detects modulated light from sensor 53 will provide at its output the direct current voltage signal of FIG. 7(A). The signals of FIG. 7(A) and FIG. 7(B) are amplified respectively by low noise amplifiers 75 and 79 and then provided to power combiner and divider circuit 80 which in combination with a receiver/network analyzer 91 is utilized to measure the polarization of the incident electromagnetic wave. The signals occurring at the outputs of low noise amplifiers 75 and 79 may be supplied to readout means 61. Readout means 61, in turn, may be a conventional two channel oscilloscope which provides an observer with a visual indication of the amplitude, phase and frequency of the incoming electromagnetic wave.

Figure 8:
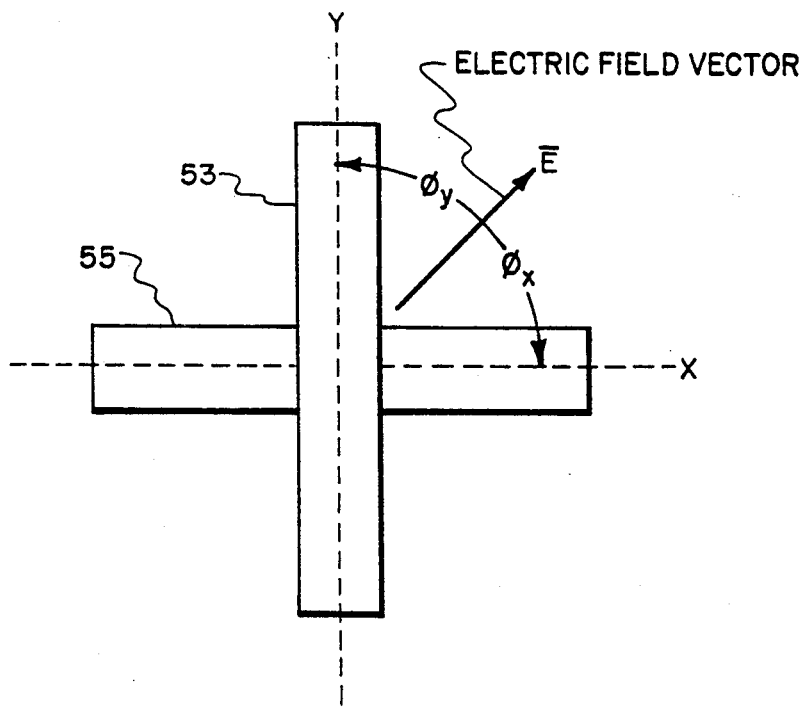
FIG. 8 illustrates the electric field vector for an incident electromagnetic wave whose polarization is being measured by the present invention.

Referring to FIGS. 4(C), 6 and 8, the electrical signal outputs of amplifiers 75 and 77 may be described by the amplitude and phase angle components of the electric field vector of an incident electromagnetic wave E detected by photonic sensors 53 and 55. The amplitude component of the electrical signal provided at the output of amplifier 75 represents the amplitude of the Y axis component of the electric field vector E, as shown in FIG. 8, and is designated by the reference letter a. Similarly, the amplitude component of the electrical signal provided at the output of amplifier 77 represents the amplitude of the X axis component of the electric field vector E and is designated by the reference letter b. As shown in FIG. 8, the phase angle between the electric field vector E and the Y axis (sensing axis of photonic sensor 53) is represented by the reference symbol $\phi_y$, while the phase angle between the electric field vector E and the X axis (sensing axis of photonic sensor 55) is represented by the reference symbol $\phi_x$. The polarization of the electric field vector E may be described completely by the phase difference $\phi$ between the x and y phase angle components of vector E, that is $\phi = \phi_6 - \phi_x$ and the magnitude ratio b/a.

The power combiner and divider circuit 80 of FIG. 6 may be used to calculate the polarization of incident electromagnetic wave when phase shifters 81 and 85 are calibrated. When incoming power is directed to output port four of hybrid tee 87, the phase difference $\phi$ and the magnitude ratio b/a are given by the following expressions:

$$\phi = \frac{\pi}{2} - \alpha \tag{1}$$

$$\frac{b}{a} = -\tan\frac{\beta + \pi}{2} \tag{2}$$

where $-\alpha$ is the phase shift of phase shifter 81 and $-\beta$ is the phase shift of phase shifter 75.

The power output component, designated by the letter s, of the electrical signal provided at port four of hybrid tee 87 is supplied to receiver 91 and may be defined by the following expression:

$$s = e^{-ja}(a + jb) \tag{3}$$

where $e^{-ja}$ is Eular notation for the complex transcendental expression:

$$e^{-ja} = -\cos\alpha + j\sin\delta \tag{4}$$

The polarization of the incident electric field vector E can then be determined by using a conventional network analyzer such as a Hewlett Packard HP8510 network analyzer.

At this time it should be noted that hybrid tees 83 and 87 in power combiner and divider circuit 80 may be replaced by conventional circulators. It should also be noted that the outputs of amplifiers 75 and 79 may be supplied to a conventional spectrum analyzer such as a Hewlett Packard 8562A Spectrum Analyzer to determine the frequency of the incident electromagnetic wave. In addition, an oscilloscope, 61, FIG. 1, may be connected to the outputs of amplifiers 75 and 79 and may be used to determine amplitude, phase, and frequency of the incident electromagnetic wave. It should further be noted that a load 89 is connected to the output port two of hybrid tee 89 allowing incoming power to be directed output port four of hybrid tee 87.

From the foregoing, it may readily be seen that the subject invention comprises a new, unique and exceedingly useful photonic electromagnetic field sensor apparatus which constitutes a considerable improvement over the known prior art. Obviously many modifications and variations of the present invention are possible in light of the above teachings. It is therefore to be understood that within the scope of the above teachings the invention may be practiced otherwise than as specifically described.

What is claimed is:

1. An electromagnetic field sensor apparatus for measuring the polarization of an incoming electromagnetic wave comprising:
   a plurality of modulating means, each of said modulating means comprising first and second electro-optic modulators, said first and second electro-optic modulators having a sensing axis positioned respectively on first and second optical paths, the sensing axis of said first electro-optic modulator being perpendicular to the sensing axis of said second electro-optic modulator;
   light source means for transmitting monochromatic light along said optical paths through each of said plurality of modulating means;
   a Luneberg lens having said plurality of modulating means positioned on and covering the entire outer surface thereof;
   said Luneberg lens intercepting said electromagnetic wave and focusing said intercepted electromagnetic wave on the first and second sensing axis of one of said plurality of modulating means;
   said modulating means upon which said electromagnetic wave is focused modulating the monochromatic light traversing at least one of said sensing axis;
   a plurality of detecting means, each of said detecting means being adapted to receive the monochromatic light exiting from one of said modulating means and to provide a pair of electrical signals in response to the monochromatic light received thereby;
   said electrical signals being modulated by said detecting means whenever the monochromatic light received by said detecting means is modulated; and
   a plurality of power combiner and divider circuit means, one of said power combiner and divider circuit means being electrically connected to each of said detecting means;
   said power combiner and divider circuit means receiving said electrical signals from said detecting means electrically connected thereto, processing said electrical signals and providing an electrical signal having a power output representative of the polarization of said incident electromagnetic wave whenever at least one of the electrical signals received thereby is modulated.

2. The electromagnetic field sensor apparatus of claim 1 wherein each of said plurality of modulating means is an electro-optic modulator.

3. The electromagnetic field sensor apparatus of claim 2 wherein said each of said electro-optic modulators is fabricated from a second order nonlinear optical polymer.

4. The electromagnetic field sensor apparatus of claim 3 wherein said second order nonlinear optical polymer is polymethylmethacrylate.

5. The electromagnetic field sensor apparatus of claim 3 wherein said second order nonlinear optical polymer is methyl nitro aniline.

6. The electromagnetic field sensor apparatus of claim 2 wherein each of said modulating means is an electro-optic crystal.

7. The electromagnetic field sensor apparatus of claim 1 wherein said power combiner and divider circuit means comprises:
   a first phase shifter having an input for receiving one of said electrical signals provided by said detecting means and an output;
   a first hybrid tee having a first input connected to the output of said first phase shifter, a second input for receiving the other of said electrical signals provided by said detecting means, and first and second outputs;
   a second phase shifter having an input connected to the first output of said first hybrid tee and an output;
   a second hybrid tee having a first input connected to the output of said second phase shifter, a second input connected to the second output of said first hybrid tee and first and second outputs; and
   a load connected to the first output of said second hybrid tee.

8. The electromagnetic field sensor apparatus of claim 7 further characterized by a network analyzer having an input connected to the second output of said hybrid tee.

9. The electromagnetic field sensor apparatus of claim 1 wherein said detecting means comprises:
   a source of direct current voltage having an output;
   a first photodiode having an anode and a cathode, the cathode of said first photodiode being connected to the output of said direct current voltage source;
   said first photodiode being adapted to receive the monochromatic light traversing one of said sensing axis of one of said plurality of modulating means;
   a first low noise amplifier having an input connected to the anode of said first photodiode and an output electrically connected to said power combiner and divider circuit means;
   a second photodiode having an anode and a cathode, the cathode of said second photodiode being connected source;
   said second photodiode being adapted to receive the monochromatic light traversing the other of said sensing axis of one of said plurality of modulating means; and
   a second low noise amplifier having an input connected to the anode of said second photodiode and an output electrically connected to said power combiner and divider circuit means;

10. The electromagnetic field sensor apparatus of wherein each of said modulating means is a Pockel cell.

11. An electromagnetic field sensor apparatus for measuring the polarization of an incoming electromagnetic wave comprising:
   a plurality of modulating means, each of said modulating means comprising first and second electro-optic modulators, said first and second electro-optic modulators having a sensing axis positioned respectively on first and second optical paths, the sensing axis of said first electro-optic modulator being perpendicular to the sensing axis of said second electro-optic modulator;
light source means for transmitting monochromatic light along said optical paths through each of said plurality of modulating means;
a Luneberg lens having said plurality of modulating means positioned on and covering the entire outer surface thereof;
said Luneberg lens intercepting said electromagnetic wave and focusing said intercepted electromagnetic wave on the first and second sensing axis of one of said plurality of modulating means;
said modulating means upon which said electromagnetic wave is focused modulating the monochromatic light traversing at least one of said sensing axis;
a plurality of detecting means, each of said detecting means being adapted to receive the monochromatic light exiting from one of said modulating means and to provide a pair of electrical signals in response to the monochromatic light received thereby;
said electrical signals being modulated by said detecting means whenever the monochromatic light received by said detecting means is modulated;
a plurality of power combiner and divider circuit means, one of said power combiner and divider circuit means being electrically connected to each of said detecting means;
said power combiner and divider circuit means receiving said electrical signals from said detecting means electrically connected thereto, processing said electrical signals and providing a third electrical signal having a power output representative of the polarization of said incident electromagnetic wave whenever at least one of the pair of electrical signals received thereby is modulated; and
receiving means for receiving said third electrical signal from said power combiner and divider circuit means and processing said third electrical signal thereby determining the polarization of said incoming electromagnetic wave;
said power combiner and divider circuit means comprising a first phase shifter having an input for receiving one of said electrical signals provided by said detecting means and an output;
a first hybrid tee having a first input connected to the output of said first phase shifter, a second input for receiving the other of said electrical signals provided by said detecting means, and first and second outputs;
a second phase shifter having an input connected to the first output of said first hybrid tee and an output;
a second hybrid tee having a first input connected to the output of said second phase shifter, a second input connected to the second output of said first hybrid tee, first output connected to said receiving means and a second output; and
a load connected to the first output of said second hybrid tee.

12. The electromagnetic field sensor apparatus of claim 11 wherein each of said modulating means is a Pockel cell.

13. The electromagnetic field sensor apparatus of claim 11 wherein each of said plurality of modulating means is an electro-optic modulator.

14. The electromagnetic field sensor apparatus of claim 13 wherein said each of said electro-optic modulator is fabricated from a second order nonlinear optical polymer.

15. The electromagnetic field sensor apparatus of claim 14 wherein said second order nonlinear optical polymer is polymethylmethacrylate.

16. The electromagnetic field sensor apparatus of claim 14 wherein said second order nonlinear optical polymer is methyl nitro aniline.

17. The electromagnetic field sensor apparatus of claim 11 wherein said detecting means comprises:
a source of direct current voltage having an output;
a first photodiode having an anode and a cathode, the cathode of said first photodiode being connected to the output of said direct current voltage source;
said first photodiode being adapted to receive the monochromatic light traversing one of said sensing axis of one of said plurality of modulating means;
a first low noise amplifier having an input connected to the anode of said first photodiode and an output electrically connected to the input of said first phase shifter;
a second photodiode having an anode and a cathode, the cathode of said second photodiode being connected to the output of said direct current voltage source;
said seocnd photodiode being adapted to receive the monochromatic light traversing the other of said sensing axis of one of said plurality of modulating means; and
a second low noise amplifier having an input connected to the anode of said second photodiode and an output electrically connected to the second input of said first hybrid tee;

18. An electromagnetic field sensor apparatus for measuring the amplitude, phase and frequency of an incoming electromagnetic wave comprising:
a plurality of modulating means, each of said modulating means comprising first and second electro-optic modulators, said first and second electro-optic modulators having a sensing axis positioned respectively on first and second optical paths, the sensing axis of said first electro-optic modulator being perpendicular to the sensing axis of said second electro-optic modulator;
light source means for transmitting monochromatic light along said optical paths through each of said plurality of modulating means;
polarizer means positioned between said light source means and said plurality of modulating means for polarizing the monochromatic light transmitted from said light source means through each of said modulating means;
a Luneberg lens having said plurality of modulating means positioned on and covering the entire outer surface thereof;
said Luneberg lens intercepting said electromagnetic wave and focusing said intercepted electromagnetic wave on the first and second sensing axis of one of said plurality of modulating means;
said modulating means upon which said electromagnetic wave is focused modulating the monochromatic light traversing at least one of said sensing axis; and
a plurality of detecting means, each of said detecting means being adapted to receive the monochromatic light exiting from one of said modulating means and to provide a pair of electrical signals in response to the monochromatic light received thereby, said electrical signals being representative of the amplitude, phase and frequency of said incoming electromagnetic wave;

19. The electromagnetic field sensor apparatus of claim 18 further characterized by readout means for receiving said electrical signals from said detecting means and in response to said electrical signals providing a visual representation of the amplitude, phase and frequency of said incoming electromagnetic wave.

20. The electromagnetic field sensor apparatus of claim 19 wherein said readout means comprises a dual channel oscilloscope.

* * * * *